United States Patent
Finney

(10) Patent No.: US 7,102,416 B2
(45) Date of Patent: Sep. 5, 2006

(54) HIGH SIDE SWITCHING CIRCUIT

(75) Inventor: Adrian Finney, Chadderton (GB)

(73) Assignee: Zetex, PLC, (GB)

( * ) Notice: Subject to any disclaimer, the term of this patent is extended or adjusted under 35 U.S.C. 154(b) by 0 days.

(21) Appl. No.: 10/909,171

(22) Filed: Jul. 29, 2004

(65) Prior Publication Data

US 2005/0035809 A1 Feb. 17, 2005

(30) Foreign Application Priority Data

Jul. 31, 2003 (GB) ................................. 0317892.8

(51) Int. Cl.
*H03K 17/687* (2006.01)
(52) U.S. Cl. ........................ 327/434; 327/112; 327/171
(58) Field of Classification Search ...................... None
See application file for complete search history.

(56) References Cited

U.S. PATENT DOCUMENTS

| | | | |
|---|---|---|---|
| 4,871,686 A | 10/1989 | Davies | 438/328 |
| 4,992,683 A | 2/1991 | Robin | 327/432 |
| 5,338,988 A | 8/1994 | Yamamura et al. | 327/306 |
| 5,376,832 A * | 12/1994 | Gariboldi et al. | 327/108 |
| 5,473,283 A | 12/1995 | Luich | 331/8 |
| 5,631,588 A * | 5/1997 | Bertolini | 327/108 |
| 5,672,992 A | 9/1997 | Nadd | 327/390 |
| 5,689,208 A | 11/1997 | Nadd | 327/390 |
| 5,874,847 A | 2/1999 | Kim et al. | 327/390 |
| 5,914,589 A | 6/1999 | Erckert | 323/282 |
| 6,201,717 B1 | 3/2001 | Grant | 363/60 |

\* cited by examiner

*Primary Examiner*—Timothy P. Callahan
*Assistant Examiner*—Terry L. Englund
(74) *Attorney, Agent, or Firm*—Anna M. Vradenburgh

(57) ABSTRACT

A high side switching circuit, comprising: a switching transistor; a charge pump drive circuit including a circuit for generating an oscillating signal; and a charge pump arranged to provide a gate drive voltage to the switching transistor in response to a control signal; wherein the charge pump is driven by the charge pump drive circuit, and the circuit for generating an oscillating signal comprises: an oscillator having a power supply input and first and second outputs, outputting first and second pulse trains respectively of the same frequency but out of phase such that when the first pulse train is high, the second pulse train is low and when the second pulse train is high, the first pulse train is low; first and second transistors connected in series with the drain of the first transistor connected to a high voltage input relative to the high level of the first and second pulse train pulses, the source of the first transistor connected to the drain of the second transistor, the source of the second transistor connected to a voltage input less than or equal to the low level of the first and second pulse train pulses, the gate of the first transistor being connected to the first output of the oscillator and the gate of the second transistor being connected to the second output of the oscillator; and an output terminal connected to the source of the first transistor thereby outputting a third pulse train in phase with the first pulse train and providing a current derived from the drain of the first transistor when the first transistor is conducting and sinking a current when the second transistor is conducting; and wherein the switching transistor and first transistor are vertical MOSFETs or IGBTs, said switching and first transistors being provided on a semiconductor substrate having first and second surfaces, such that said switching and first transistors have a common drain contact provided on said second surface of the substrate.

5 Claims, 2 Drawing Sheets

HIGH SIDE SWITCHING CIRCUIT

RELATED APPLICATIONS

Figure 1:
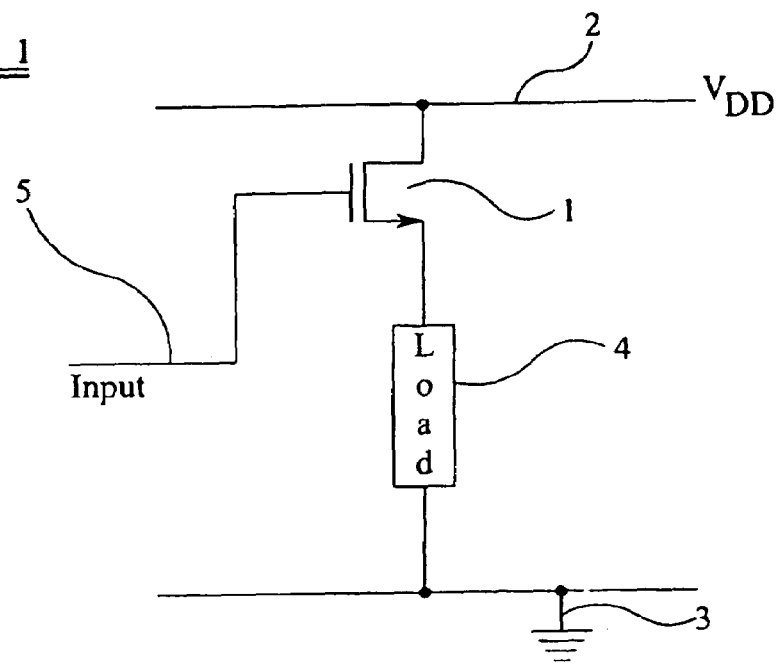

This application is related to, and claims priority from British Patent Application No. 0317892.8, entitled A Circuit For Generating An Oscillating Signal, filed on Jul. 31, 2003, which is fully incorporated herein by reference.

The present invention relates to a high side switching circuit. In particular, the invention relates to a charge pump drive circuit, and more particularly to a drive pump charge circuit within a high side switching circuit.

High side switching circuits, (where the load is driven from the source of a power transistor), are typically used in automotive applications where the ground of all of the loads are connected to the chassis of the vehicle. The main component of the switching circuit is a power transistor (typically a MOSFET), which passes current to a load connected to its source. For such a circuit to be constructed using an n-channel MOSFET (NMOS) switching transistor it is necessary that the gate of the switching transistor is provided with a voltage higher than that connected to the drain. In practice, this requires that the gate is provided with a voltage $V_{dd}$ that is higher than the supply voltage to the high side switching circuit (supplied to the drain of the switching transistor). In principle a p-channel MOSFET (PMOS) switching transistor would provide a simpler alternative as to turn on the PMOS transistor would require a voltage between the supply voltage and ground which can be easily supplied internal to the circuit. However, PMOS transistors are not typically used, as they are relatively more expensive and larger than NMOS components.

Accordingly high side switches are conventionally based on NMOS transistors, the higher gate voltage typically being generated using some form of charge pump, which is a circuit that in response to a pulsing input can store progressively higher voltages across a capacitor to provide a voltage source of greater amplitude than the pulsing input.

The circuitry required to generate the necessary gate voltage within a high side switching circuit using an NMOS transistor may be implemented using discrete components together with a discrete NMOS switching transistor. However, it is now more common to provide these functions within a single device, typically comprising an NMOS transistor combined with an associated integrated circuit. The integrated circuit typically contains some self protection circuitry, logic and the charge pump to drive the gate of the switching transistor. Such a high side switching circuit is sometimes known as a smart power transistor, or simply a high side switch. For the purposes of the present invention the term high side switching circuit is taken to refer to a circuit incorporating a switching transistor and associated circuit functions, including both integrated circuits and circuits made from discrete components.

High side switching circuits are typically three terminal circuits that are switched on (allowing current to flow in the switching transistor) by connecting an external gate terminal to ground. Such a three terminal high side switching circuit requires that all the charge to drive the gate of the switching transistor must be derived from the drain potential as no charge can be derived from the ground connection. It is also common to provide a four terminal high side switching circuit which is switched on by supply of a positive bias (with respect to ground) to the gate. In such a four terminal high side switching circuit it nevertheless remains advantageous to derive much of the charge from the drain to reduce the load on external integrated circuits.

In either case to turn on the switching transistor it is necessary to generate a bias above the supply voltage $V_{dd}$ and apply this to the gate of the switching transistor, such that the switching transistor is switched on and current may flow through the transistor from the supply voltage to the voltage load terminal and hence power the load. There are various approaches to generation of the required gate bias.

For example U.S. Pat. No. 5,914,589 describes a voltage boosting circuit for high side NMOS switching circuits that may be implemented within a smart high side switch. This uses both the charge from the drain supply of the switching transistor and a charge pump to provide the bias above $V_{dd}$ necessary to switch the switching transistor on. Within this circuit a lateral switching component is used to derive charge from the drain supply. To supply this high level of charge the lateral switching component must be able to tolerate the entire drain to ground voltage swing so it can source current from the drain. Such a lateral component increases process complexity and also the cost of the circuit. Additionally, the charge pump is only switched in when the source voltage of the switching transistor is approaching the drain supply voltage, otherwise the drain voltage is used directly. A disadvantage of this is the relative complexity of the design required to incorporate the additional switching components.

U.S. Pat. Nos. 5,473,283, 5,689,208 and 5,672,992 describe alternative designs of charge pump circuits for driving high side switches, with part or all of the charge derived from the drain. All three require high voltage lateral integrated circuit elements with the associated complexity and cost implications.

It is an object of the present invention to obviate or mitigate the above disadvantages.

According to the present invention there is provided a high side switching circuit, comprising: a switching transistor; a charge pump drive circuit including a circuit for generating an oscillating signal; and a charge pump arranged to provide a gate drive voltage to the switching transistor in response to a control signal; wherein the charge pump is driven by the charge pump drive circuit, and the circuit for generating an oscillating signal comprises: an oscillator having a power supply input and first and second outputs, outputting first and second pulse trains respectively of the same frequency but out of phase such that when the first pulse train is high, the second pulse train is low and when the second pulse train is high, the first pulse train is low; first and second transistors connected in series with the drain of the first transistor connected to a high voltage input relative to the high level of the first and second pulse train pulses, the source of the first transistor connected to the drain of the second transistor, the source of the second transistor connected to a voltage input less than or equal to the low level of the first and second pulse train pulses, the gate of the first transistor being connected to the first output of the oscillator and the gate of the second transistor being connected to the second output of the oscillator; and an output terminal connected to the source of the first transistor thereby outputting a third pulse train in phase with the first pulse train and providing a current derived from the drain of the first transistor when the first transistor is conducting and sinking a current when the second transistor is conducting; and wherein the switching transistor and first transistor are vertical MOSFETs or IGBTs, said switching and first transistors being provided on a semiconductor substrate having first and second surfaces, such that said switching and first transistors have a common drain contact provided on said second surface of the substrate.

The output of the oscillator circuit according to the present invention is a pulse train with frequency and phase fixed by the oscillator and amplitude equal to the amplitude of the first pulse train applied to the gate of the first transistor minus the threshold voltage of the first transistor. The advantage is that the charge provided at the output terminal of the circuit is derived from the high voltage supply and may be significant, whereas only a relatively low amount of charge is required to switch the first and second transistors. Therefore, a pulse train providing a small current can drive a pulse train providing a much higher current.

The present invention is particularly advantageous when incorporated in a high side switching circuit based on an NMOS switching transistor, with the high voltage supplied to the drain of the first transistor derived from the drain input of the switching transistor.

Preferably, when the first pulse train is low, the second pulse train is high and when the second pulse train is low, the first pulse train is high.

Preferably, the first and second pulse trains have substantially the same high level and low level.

Preferably, the second transistor is a vertical MOSFET or IGBT.

Preferably, the first transistor and switching transistor have separate respective gate and source contacts. Thus preferred embodiments provide the switching transistor and the first transistor with essentially the same structure avoiding the high cost of providing high voltage lateral devices.

Other preferred features and, advantages, of the present invention will become apparent from the following description.

Figure 2:
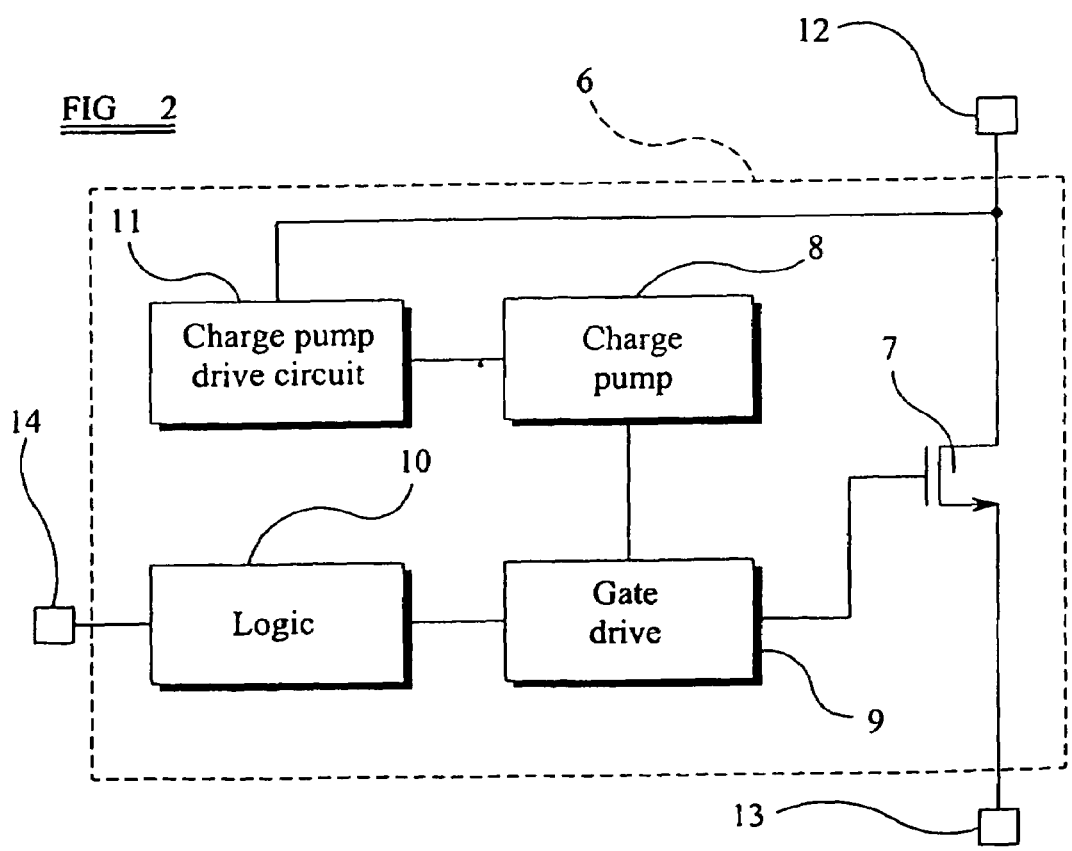
Figure 3:
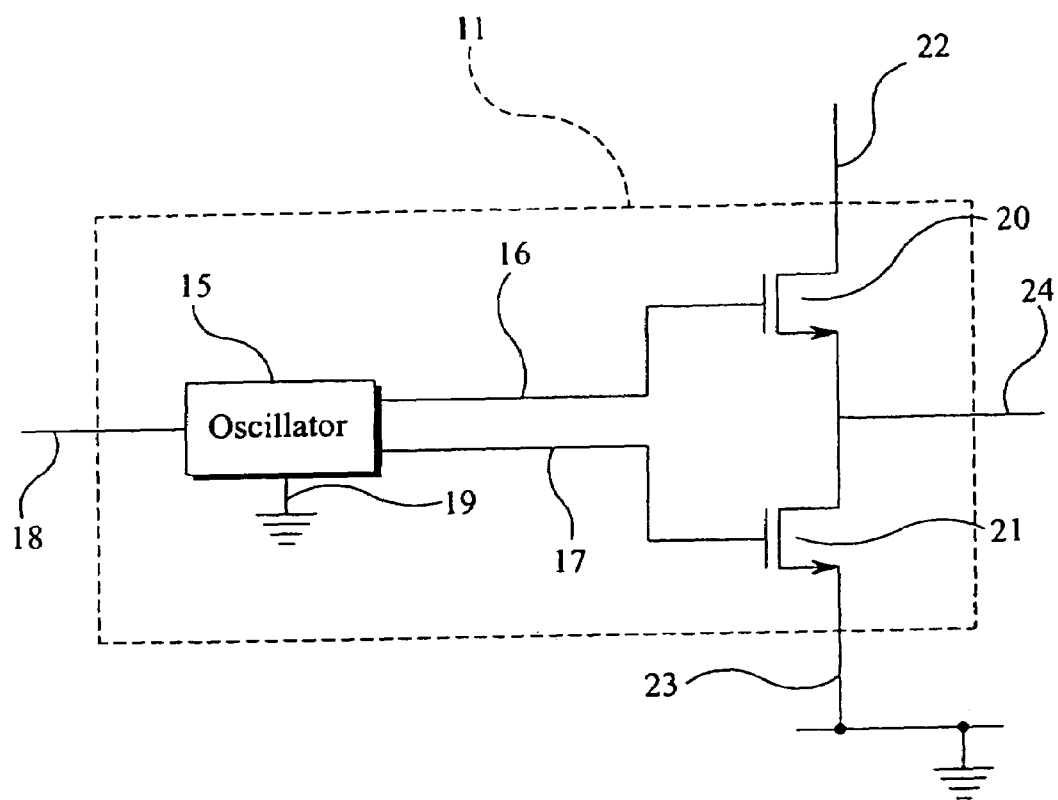

Specific embodiments of the present invention will now be described, by way of example only, with reference to the accompanying drawings, in which:

FIG. 1 is a circuit diagram illustrating the general configuration of a high side switch driving a load;

FIG. 2 schematically illustrates a high side switching circuit in accordance with an embodiment of the present invention; and FIG. 3 illustrates the components of a circuit for generating an oscillating signal in accordance with the present invention and comprising the charge pump drive circuit of the switching circuit of FIG. 2.

Referring first to FIG. 1, this illustrates the general configuration of a typical high side switch driving a load. A high side switch 1, is coupled between a positive supply voltage 2 ($V_{dd}$) and a negative voltage rail 3, with its drain connected directly to the positive supply rail 2 and its source coupled to the negative voltage rail 3 via the circuit load 4. An input voltage signal 5 is connected to the gate contact of the high side switch 1.

When the input voltage 5 to the gate contact 1 is set to the appropriate level the transistor 1 is switched on. Current can then flow from the positive supply voltage 2 through the switch 1 and the load 4 to the negative voltage rail 3, (normally connected to ground, as shown). When the required gate voltage is removed the transistor 1 is switched off and the current to the load 4 is also removed.

For simplicity the high side switch 1 is shown as a single component, namely an NMOS transistor (the switching transistor). In practice, the switching transistor will be implemented in a switching circuit which includes additional components, in particular including charge pump circuitry providing the gate input signal 5. As mentioned above, although such switching circuits can be fabricated from discrete components it is now conventional to integrate the various components in a single integrated circuit often referred to as a smart FET.

Referring to FIG. 2, this schematically illustrates components of a high side switching circuit 6 in accordance with the present invention. The switching circuit 6 is based on an NMOS switching transistor 7. The required gate drive voltage is provided by a charge pump 8 via a gate drive circuit 9 in response to a control signal supplied from a logic circuit 10. The charge pump 8 is driven by a charge pump drive circuit 11 according to the present invention.

The illustrated switching circuit 6 is a three terminal circuit. The positive supply voltage $V_{dd}$ is provided to the drain contact 12 of the switching transistor 7, a voltage load contact 13 being connected to the source of the switching transistor 7 (i.e. the source contact). The third terminal is a control input terminal 14, i.e. the gate contact, which is connected to the logic circuit 10.

It will be appreciated that four terminal and other more complex switching circuits may have additional input to the logic circuit 10. Similarly, additional circuitry, such as over current protection circuitry may be included in the switching circuit and connected to the logic circuit 10 to provide additional control of the on/off state of the switching transistor 7.

Logic circuit 10 is connected to the gate contact 14 such that it interprets the input state and controls the operation of the rest of the switching circuit 6 accordingly i.e. to turn the switching transistor 7 on and off as appropriate. The logic circuit 10 is also connected to the gate drive 9, which is connected to the gate of the switching transistor 7. Operation of the gate drive 9 determines whether or not the charge pump output is passed through to the gate of the switch transistor 7. Charge pump drive circuit 11 connects to the charge pump 8 to provide the input signal for the charge pump.

When the gate contact 14 is switched to the appropriate level (which in the case of three terminal device is generally ground) this is detected by the logic circuit 10 and causes the gate drive 9 to switch the output of charge pump 8 to the gate of switching transistor 7. The charge pump drive 11 provides a pulse train sequence to the charge pump 8 which then generates a sufficient bias applied to the gate of the transistor 7 via the gate drive circuit to allow current to flow from the drain contact 12 to the source contact 13 and thus to the load 4.

The charge pump drive circuit 11 is an oscillator circuit according to the present invention as illustrated in more detail in FIG. 3. The circuit 11 comprises an oscillator 15, with first and second outputs 16 and 17, a voltage supply input 18 and a ground connection 19. The oscillator supply voltage is relatively low compared to the switching circuit supply voltage $V_{dd}$. The outputs 16, 17 are supplied to the gates of first and second NMOS transistors 20 and 21 respectively. The first and second transistors 20 and 21 are connected in series with the drain 22 of the first transistor connected to the switching circuit voltage supply $V_{dd}$ (which is a high voltage relative to the voltage supply 18 provided to the oscillator 15), the source of the first transistor 20 is connected to the drain of the second transistor 21, and the source of the second transistor 21 is connected to a ground contact 23. The oscillator circuit 11 has an output 24 taken from the source of the first transistor 20 (which is also the drain of the second transistor 21).

The oscillator 15 is designed to provide a relatively low voltage pulse train output ranging from positive to ground on the first oscillator output 16 and to provide the inverse of this pulse train on the second oscillator output 17. Appropriate oscillator design will be well known to the skilled person and may be entirely conventional (and thus will not be described in detail here).

In operation the oscillator 15 provides two pulse trains on outputs 16 and 17, one the inverse of the other, ranging from 0 to high and high to 0 respectively. These are applied to the gates of the first transistor 20 and the second transistor 21 respectively such that when either one has the high potential applied at its gate it will be switched on and vice versa. Thus transistors 20 and 21 are turned on and off alternatively such that neither is conducting at the same time. When transistor 20 is turned on the voltage at its source, i.e. the oscillator circuit output 24, is equal to the gate voltage of transistor 20, i.e. the amplitude of pulse train 16, minus the low threshold voltage of the first transistor, $V_{th}$. The first transistor 20 is selected to have a low on resistance (RDSon) despite its high voltage capability so that the current derived from the high voltage input $V_{dd}$ and provided to the output 24 is considerable.

When the oscillator 11 switches over, i.e. the second transistor 21 becomes conducting and the first transistor 20 is switched off, the output 24 is switched to low voltage (usually ground). The second transistor 21 can sink significant current because it only needs to be low voltage so it can also have a low resistance.

The output 24 of the oscillator circuit 11 is therefore a high current pulse train with frequency and phase fixed by the relatively low voltage oscillator 15 and amplitude fixed by the amplitude of pulse train 16 and the threshold voltage of the first transistor 20 (which effectively operates as a current buffer).

Referring again to FIG. 2, it will now be appreciated that with the charge pump drive circuit 11 (oscillator circuit) of the present invention the whole of the charge necessary to raise the voltage at the gate of the switching transistor 7 is derived from its drain contact 12. This approach does not draw power from external circuitry connected to the gate contact of the high side switching circuit, and does not require additional complexity in switching between a charge pump powered by external circuitry and the drain voltage. Disadvantages associated with prior art high side switching circuits are thus obviated.

The first transistor 20 and switching transistor 7 are preferably vertical devices having a common drain but with separate source and gate contacts. The first transistor need not necessarily be situated immediately adjacent the switching transistor on the same substrate, but nevertheless providing the two transistors with essentially the same structure avoids the need for expensive high voltage lateral devices.

It will be appreciated that while the present invention will generally be implemented in a high side switching circuit, the circuit for generating an oscillating signal according to the present invention could be included in other circuit applications. Possible modifications and applications of the present invention will be readily apparent to the appropriate skilled person.

The invention claimed is:

1. A high side switching circuit, comprising:

a switching transistor;

a charge pump drive circuit including a circuit for generating an oscillating signal; and a charge pump arranged to provide a gate drive voltage to the switching transistor in response to a control signal;

wherein the charge pump is driven by the charge pump drive circuit, and the circuit for generating the oscillating signal comprises:

an oscillator having a power supply input and first and second outputs, outputting first and second pulse trains respectively of the same frequency but out of phase such that when the first pulse train is high, the second pulse train is low and when the second pulse train is high, the first pulse train is low;

first and second transistors connected in series with the drain of the first transistor connected to a high voltage input higher than the high level of the first and second pulse train pulses, the source of the first transistor connected to the drain of the second transistor, the source of the second transistor connected to a voltage input less than or equal to the low level of the first and second pulse train pulses, the gate of the first transistor being connected to the first output of the oscillator and the gate of the second transistor being connected to the second output of the oscillator;

and an output terminal connected to the source of the first transistor thereby outputting a third pulse train in phase with the first pulse train and providing a current derived from the drain of the first transistor when the first transistor is conducting and sinking a current when the second transistor is conducting; and wherein the switching transistor and first transistor are vertical MOSFETs or IGBTs, said switching and first transistors being provided on a semiconductor substrate having first and second surfaces, such that said switching and first transistors have a common drain contact provided on said second surface of the substrate.

2. A high side switching circuit according to claim 1, wherein the first and second pulse trains have a 50% duty cycle.

3. A high side switching circuit according to claim 1, wherein the first and second pulse trains have substantially the same high level and low level.

4. A high side switching circuit according to claim 1, wherein the second transistor is a vertical MOSFET or IGBT.

5. A high side switching circuit according to claim 1, wherein the first transistor and switching transistor have separate respective gate and source contacts.

* * * * *